US009660044B2

(12) United States Patent
Reynes et al.

(10) Patent No.: US 9,660,044 B2
(45) Date of Patent: May 23, 2017

(54) POWER FIELD EFFECT TRANSISTOR, A POWER FIELD EFFECT TRANSISTOR DEVICE AND A METHOD OF MANUFACTURING A POWER FIELD EFFECT TRANSISTOR

(71) Applicants: Jean Michel Reynes, Pompertuzat (FR); Graeme John Anderson, Austin, TX (US); Pierre Jalbaud, Segreville (FR); Dale Neil Vaughan, Austin, TX (US)

(72) Inventors: Jean Michel Reynes, Pompertuzat (FR); Graeme John Anderson, Austin, TX (US); Pierre Jalbaud, Segreville (FR); Dale Neil Vaughan, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/916,511

(22) PCT Filed: Sep. 5, 2013

(86) PCT No.: PCT/IB2013/002406
§ 371 (c)(1),
(2) Date: Mar. 3, 2016

(87) PCT Pub. No.: WO2015/033181
PCT Pub. Date: Mar. 12, 2015

(65) Prior Publication Data
US 2016/0225869 A1 Aug. 4, 2016

(51) Int. Cl.
*H01L 29/78* (2006.01)
*H01L 29/49* (2006.01)
(Continued)

(52) U.S. Cl.
CPC ...... *H01L 29/4983* (2013.01); *H01L 29/1095* (2013.01); *H01L 29/66712* (2013.01);
(Continued)

(58) Field of Classification Search
CPC .................... H01L 29/42356; H01L 29/42376
(Continued)

(56) References Cited

U.S. PATENT DOCUMENTS 4,466,176 A * 8/1984 Temple ................. H01L 21/033
257/133
5,395,778 A * 3/1995 Walker ............. H01L 27/11543
257/E21.688
(Continued)

FOREIGN PATENT DOCUMENTS

EP 0 993 033 A1 4/2000
JP 2005-228868 A 8/2005
(Continued)

OTHER PUBLICATIONS

International Search Report for application PCT/IB2013/002406 (Sep. 5, 2013).
(Continued)

*Primary Examiner* — George Fourson, III
(74) *Attorney, Agent, or Firm* — Charlene R. Jacobsen

(57) ABSTRACT

A power field effect transistor, a power field effect transistor device and a method of manufacturing a power field effect transistor are provided. During the manufacturing of the power field effect transistor, a body drive stage to manufacture the body region of the power field effect transistor is shortened to obtain a relatively low on resistance for the power field effect transistor. Before the implanting stage of the dopants of the body region, a pre body drive stage is introduced. During the pre body drive stage and the body drive stage sidewalls of a polysilicon layer of the power field (Continued)

effect transistor are oxidized to obtain a power field effect transistor which has at the sidewalls an oxidized polysilicon layer that is thick enough to prevent a premature current injection from the gate to the source regions of the power field effect transistor.

11 Claims, 7 Drawing Sheets

(51) Int. Cl.
    *H01L 29/66*           (2006.01)
    *H01L 29/423*         (2006.01)
    *H01L 29/10*           (2006.01)

(52) U.S. Cl.
    CPC .... *H01L 29/66719* (2013.01); *H01L 29/7802* (2013.01); *H01L 29/1045* (2013.01); *H01L 29/42356* (2013.01); *H01L 29/42368* (2013.01); *H01L 29/42376* (2013.01)

(58) Field of Classification Search
    USPC .................................................. 257/341, 345
    See application file for complete search history.

(56) References Cited

U.S. PATENT DOCUMENTS

| | | | | |
|---|---|---|---|---|
| 6,352,885 | B1* | 3/2002 | Wieczorek | H01L 29/42368 257/E21.345 |
| 6,352,934 | B1* | 3/2002 | Lee | H01L 21/31116 257/E21.252 |
| 6,391,752 | B1* | 5/2002 | Colinge | H01L 21/2652 257/E21.337 |
| 8,476,697 | B1* | 7/2013 | Cooper | H01L 21/046 257/327 |
| 2002/0006716 | A1 | 1/2002 | Jang et al. | |
| 2002/0100936 | A1 | 8/2002 | Frisina et al. | |
| 2002/0119631 | A1* | 8/2002 | Tseng | H01L 21/28518 438/305 |
| 2003/0218219 | A1* | 11/2003 | Sohn | H01L 21/823807 257/408 |
| 2005/0085074 | A1* | 4/2005 | Powell | H01L 21/32105 438/689 |
| 2005/0098813 | A1* | 5/2005 | Sekiguchi | H01L 27/10873 257/296 |
| 2006/0157750 | A1* | 7/2006 | Kim | H01L 21/76895 257/288 |
| 2006/0240625 | A1 | 10/2006 | Loechelt et al. | |
| 2009/0079008 | A1* | 3/2009 | Nandakumar | H01L 21/26506 257/377 |
| 2012/0292682 | A1 | 11/2012 | Pan et al. | |
| 2013/0171814 | A1* | 7/2013 | Torii | H01L 21/28273 438/593 |
| 2015/0318177 | A1* | 11/2015 | Ando | H01L 29/40 257/402 |

FOREIGN PATENT DOCUMENTS

WO     WO-03/107432 A1     12/2003
WO     WO-2006/063614 A1     6/2006

OTHER PUBLICATIONS

Pfiester, James R. et al; "Poly-Gate Sidewall Oxidation Induced Submicrometer MOSFET Degradation"; IEEE Electron Device Letters, vol. 10, No. 8; pp. 367-369 (Aug. 1989).

Wong, Catherine Y. et al; "Sidewall Oxidation of Polycrystalline-Silicon Gate"; IEEE Electron Device Letters, vol. 10, No. 9; pp. 420-422 (Sep. 1989).

\* cited by examiner

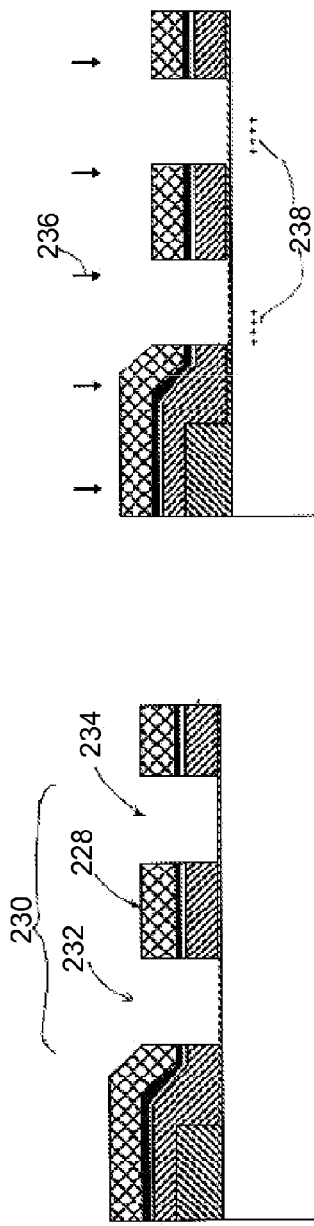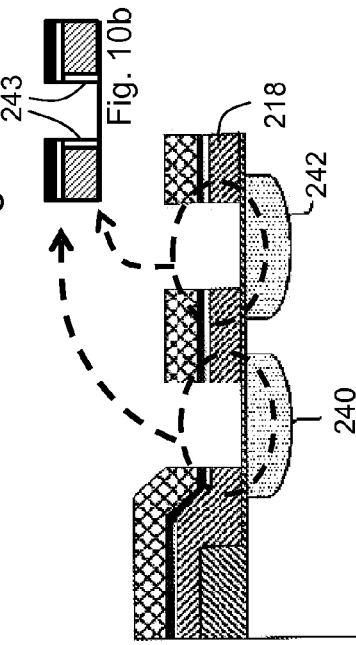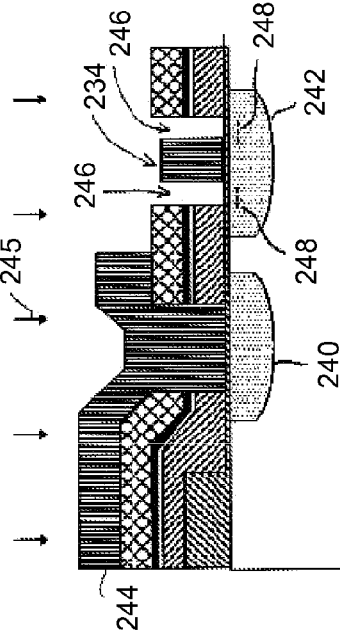

POWER FIELD EFFECT TRANSISTOR, A POWER FIELD EFFECT TRANSISTOR DEVICE AND A METHOD OF MANUFACTURING A POWER FIELD EFFECT TRANSISTOR

FIELD OF THE INVENTION

This invention relates to power field effect transistors, power field effect transistor devices and a method of manufacturing a power field effect transistor. Power field effect transistors are configured to operate under relatively large voltages, for example, voltages larger than 500 volts, or even larger than 1 kVolt. Thus, power field effect transistors have a relatively large breakdown voltage. When a plurality of power field effect transistors are combined in one device, the device is capable of conducting relatively large currents, for example, current larger than 250 ampere, or even larger than 500 ampere.

BACKGROUND OF THE INVENTION

Semiconductor devices such as Metal Oxide Semiconductor Field Effect Transistors (MOSFETs) are commonly used as power devices in applications, such as automotive electronics, power supplies, telecommunications, which applications require devices to operate at currents in the range of tenths up to hundreds of amperes (A).

Conventionally, by applying a voltage to the gate electrode of a MOSFET device, a channel will be formed connecting the source and the drain regions allowing a current to flow. Once the MOSFET device is turned on, the relation between the current and the voltage is nearly linear which means that the device behaves like a resistance. The resistance is referred to as the on-state resistance Rdson.

Typically, power MOSFET devices with low on-state resistance Rdson are preferred as they have higher current capability. In the power MOSFET devices typically a plurality of transistor base cells are arranged in parallel for reducing the Rdson and the on-state resistance Rdson may be decreased by increasing the packing density of a power MOSFET device i.e. the number of base cells per $cm^2$. The plurality of parallel arranged transistor base cells may be different shapes, such as hexagonal cells, fingers, strips or waves. US2006/0145252A1 discloses a power semiconductor device comprising a plurality of transistor base cells having a four branch shape.

Document U.S. Pat. No. 6,365,931B1 presents a gate isolation structure which is suitable for isolating the gates of the above discussed power devices. FIG. 1 presents a cross-section view of the structure of the gate insulating structure. The N substrate 1 comprises an P-region 2 in which N material source regions 3 are provided. Partly above the source regions 3, the P-region 2 and the N substrate 1 a gate oxide layer 4 is provided and on a sub area of the gate oxide layer is provided an insulated gate 5 of polysilicon. On top of the gate 5 is an oxide layer deposited and at the lateral wall of the gate 5 is provided an oxide layer 9 separating the gate 5 from other layers. Around the gate 5, oxide layer 9 is provided a nitride layer 10. Adjacent to the lateral walls of the nitride layer 10 and on top of a portion of the nitride layer which is on top of the gate oxide layer 4, a oxide spacer 8 is provided and a metal layer 7 is deposited on top of the above discussed structure for forming the source contact. A backside surface (not shown) of the N substrate 1, which is a surface that is opposite the surface on which the gate oxide layer 4 is provided, is provided with a drain contact. According to the cited patent in a specific processing step, the oxide layer 9 is placed, thus, an additional process handling is used to manufacture the oxide layer 9. Additionally, the cited document proposes a thickness for the oxide layer 9 that is about equal to the thickness of the gate oxide layer 4. Depositing the oxide layer 9 is a relatively complex process step. According to the cited document, the oxide layer 9 is made during second dopant ion implantation and consequent diffusion for obtaining the source regions 3 by comprising oxidation for the oxide layers 9 formation on the sidewalls of the polysilicon layer 5.

SUMMARY OF THE INVENTION

The present invention provides a power field effect transistor, a power field effect transistor device and a method of manufacturing a power field effect transistor as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

Elements in the figures are illustrated for simplicity and clarity and have not necessarily been drawn to scale. In the Figures, elements which correspond to elements already described may have the same reference numerals.

DETAILED DESCRIPTION OF THE PREFERRED EMBODIMENTS

Figure 1:
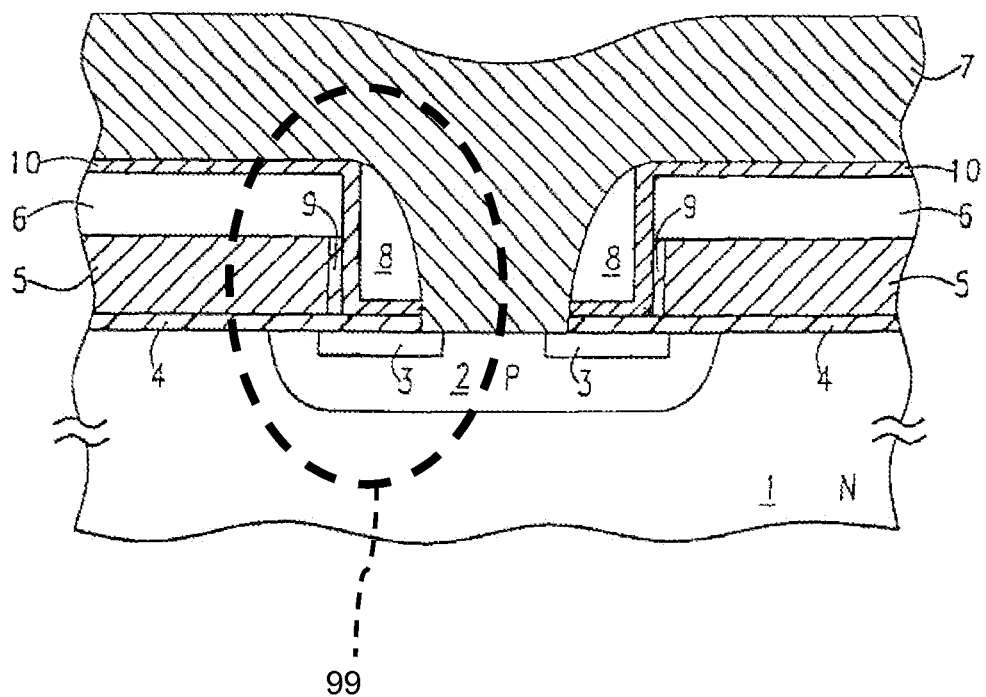
FIG. 1 schematically shows a prior art example of a gate isolation structure.
Figure 2:
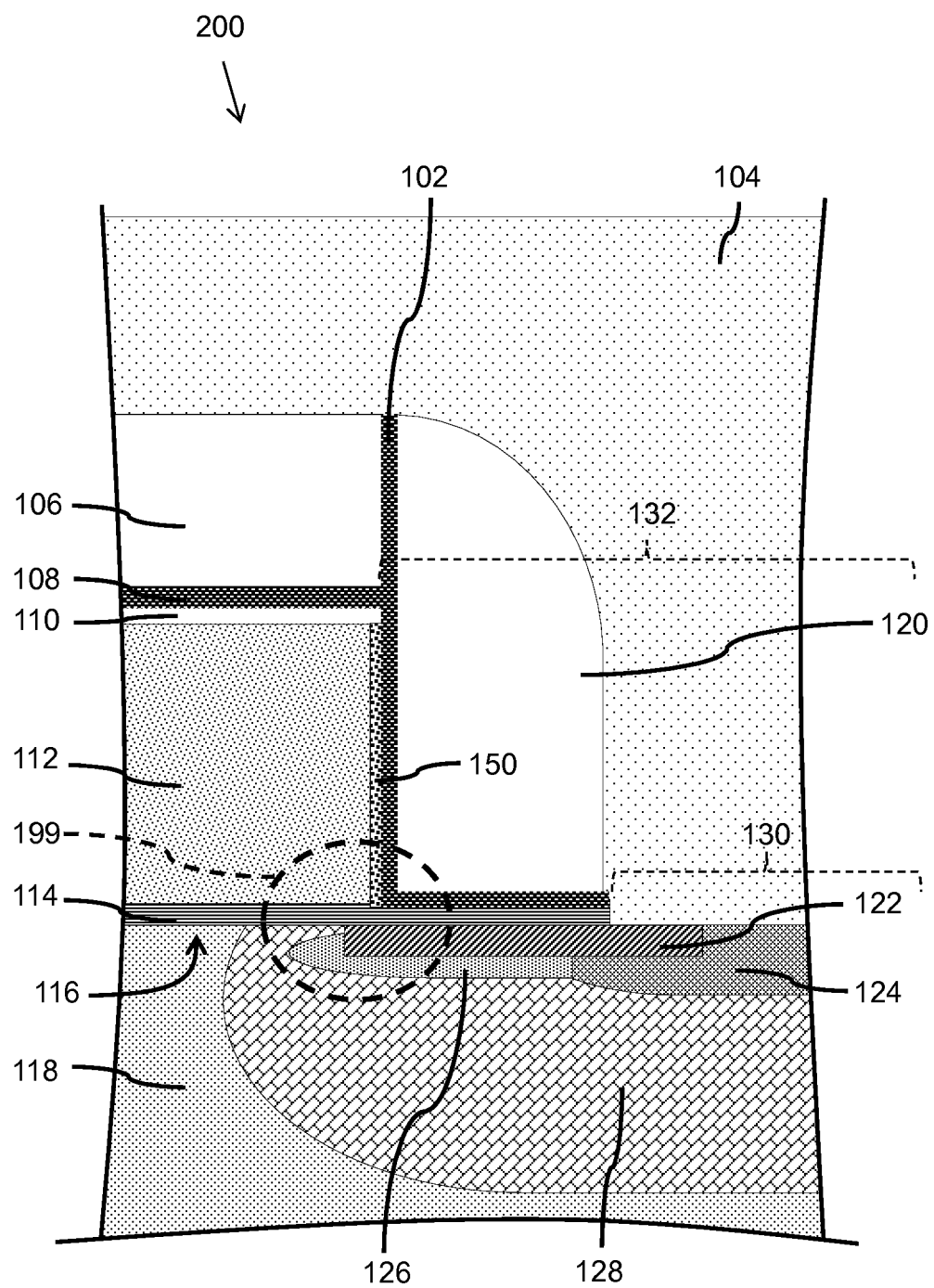
FIG. 2 schematically shows an embodiment of a power field effect transistor according to this document, FIG. 3 schematically shows a detail of an embodiment of a power field effect transistor, FIGS. 4 to 19 schematically show cross-sectional views of a wafer on which a power field effect transistor is manufactured, the cross-sectional views represent different stages of the manufacturing process—it is to be noted that after FIG. 7 the scale changes towards a more zoomed-in view of the wafer.

FIG. 2 schematically shows an embodiment of a portion of a power field effect transistor 200 according to the claims of this document. As indicated at the left side, the right side and the bottom end of the Figure, the power field effect transistor 200 extends further into these directions. It is to be noted that the portion that is shown in FIG. 2 relates to the encircled portion 99 of the prior art device of FIG. 1. Thus, the structure shown in FIG. 2 continues at the right end with a mirrored configuration that is similar to the presented structure of FIG. 2. The presented embodiment of FIG. 2 is a cross-sectional view of the power field effect transistor 200—the cross-sectional view is made in a direction that is perpendicular to an epitaxial layer 118. As discussed previously, power field effect transistors may have different shapes, and in an embodiment, the basis shape of the power field effect transistor 200 seen in a top view (which is when one looks towards the power field effect transistor 200 from the top side of the power field effect transistor 200 being the side where the conducting material 104 is provided) is the shape that is disclosed in the patent application US2006/0145252. The cross sectional view of FIG. 2 corresponds to a cross sectional view along a portion of line C-C of FIGS. 4 and 5 of US2006/0145252A1.

The basis of the power field effect transistor 200 is a substrate (not shown) of a first conductivity type on which an epitaxy layer 118 of a first conductivity type is provided. Within this layer, a body region 128 of a second conductivity type is present. The body region 128 extends from a first side 116 of the epitaxy layer 118 into the epitaxy layer 118. Optionally, within the body region 128 is provided a region 124 which has a higher doping concentration of the second conductivity doping than the doping concentration of the second conductivity doping of the body region 128. The region 124 extends from the first side 116 into the body region 128. Optionally, within the body region 128 is also provided a protection region 126 which is defined in, and has characteristics according to document U.S. Pat. No. 8,188,539. A source region 122 with a majority of dopants of the first conductivity type, which may have an annular shape, is provided within the body region 128, and more in particular, in the optional protection region 126 and the optional region 124. In an embodiment, the first conductivity type is based on N dopants and the second conductivity type is based on P dopants. In another embodiment, the first conductivity type is based on P dopants and the second conductivity type is based on N dopants.

On top of the epitaxy layer 118 and at least partially on top of the respective body region 128, region 124, protection region 126 and the source region 122 a (patterned) gate oxide layer 114 is provided which has a first opening 130 adjacent to the body region 128 with the region 124, with the protection region 126 and with the source region 122. A portion of the source region 122 extends below the (patterned) gate oxide layer 114 and another portion of the source region 122 is adjacent to the first opening 130 of the gate oxide layer 114. On top of the gate oxide layer 114 is provided a (patterned) stack of a (patterned) polysilicon layer 112, a (patterned) first oxidized polysilicon layer 110 and a (patterned) first silicon nitride layer 108. The stack has a second opening 132 which is larger than the first opening 130 and which fully overlaps with the first opening 130. On top of the stack may be provided an inter layer dielectric layer 106. A sidewall of the polysilicon layer 112, which is the sidewall that faces towards the second opening 132 (and, thus, also to the first opening 130) is provided with a second oxidized polysilicon layer 150. A second silicon nitride layer 102 is provided to the complete sidewall of the stack, and, thus to the second oxidized polysilicon layer 150. The second silicon nitride layer 102 also extends over a surface of the gate oxide layer 114 that is not covered by the stack. In a corner defined by the second silicon nitride layer 102 is provide a spacer 120 of a dielectric material, for example, a TEOS oxide layer. TEOS is an abbreviation for Tetraethyl orthosilicate. Within the space defined by the spacer(s) 120 an electrically conductive material 104, for example, aluminium silicon, is provided for providing a source contact. A first side of the substrate (not shown) which is opposite a second side of the substrate on which the epitaxy layer 118 is provided, an electrically conductive layer (not shown) may be provided for forming a drain contact.

The electrical operation of the power field effect transistor 200 is earlier described in several patent applications which disclose similar power field effect transistors. When an adequate voltage is applied to the gate, which is formed by polysilicon layer 112, a channel is formed between the source region 122 and the drain (not shown) through which a current may flow.

In an embodiment, a power field effect transistor device (not shown) is provided which comprises a plurality of power field effect transistors 200. In line with for example, the disclosure of US2006/0145252, the plurality of power field effect transistors 200 may be combined in a specific pattern to obtain a relatively low on-state resistance Rdson for the power field effect transistor device. It is to be noted that the plurality of power field effect transistors 200 are combined on a single substrate.

It is to be noted that, in a further embodiment, the power field effect transistor 200 may be manufactured with a manufacturing technology in which a body drive time is relatively short to obtain a relatively low on-state resistance for the power field effect transistor 200. In the body drive stage, which shortly follows after a stage of implanting dopants of the second conductivity type, the actual body region 128 is formed. The body drive stage comprises a thermal step in which the power field effect transistor under production (and ready in so far as possible at this stage) is given a thermal treatment of at least 850 degrees Celsius. In an embodiment, the body drive stage (after implanting the dopants of the second conductivity type) comprises a thermal treatment that is shorter than 45 minutes to obtain a relatively low on-state resistance for the power field effect transistor 200. By reducing the body drive time from 80 minutes to 40 minutes, the on-state resistance Rdson is reduced by 15%. If, for example, half a million power field effect transistor base cells (as power field effect transistor 200) are combined on a power field effect transistor device, and when power field effect transistors are used with a breakdown voltage of 25 volts and the on-state resistance Rdson of the power field effect transistor device was measured at a moment in time that the gate source voltage Vgs was 10 volts, the on-state resistance Rdson was reduced from 0.7 mOhms down to 0.55 mOhms as the result of significantly reducing the body drive time. In another example, if 1 million power field effect transistor base cells as discussed above (breakdown voltage 25 volts) are combined on a power field effect transistor device, and the Rdson of the power field effect transistor device was measured at a moment in time that the gate source voltage Vgs was 10 volts, the on-state resistance Rdson was reduced from 0.35 mOhms down to 0.275 mOhms as the result of significantly reducing the body drive time. In another example, with power field effect transistors with a breakdown voltage of 45 Volts, a reduction of 10% was obtained.

Figure 3:
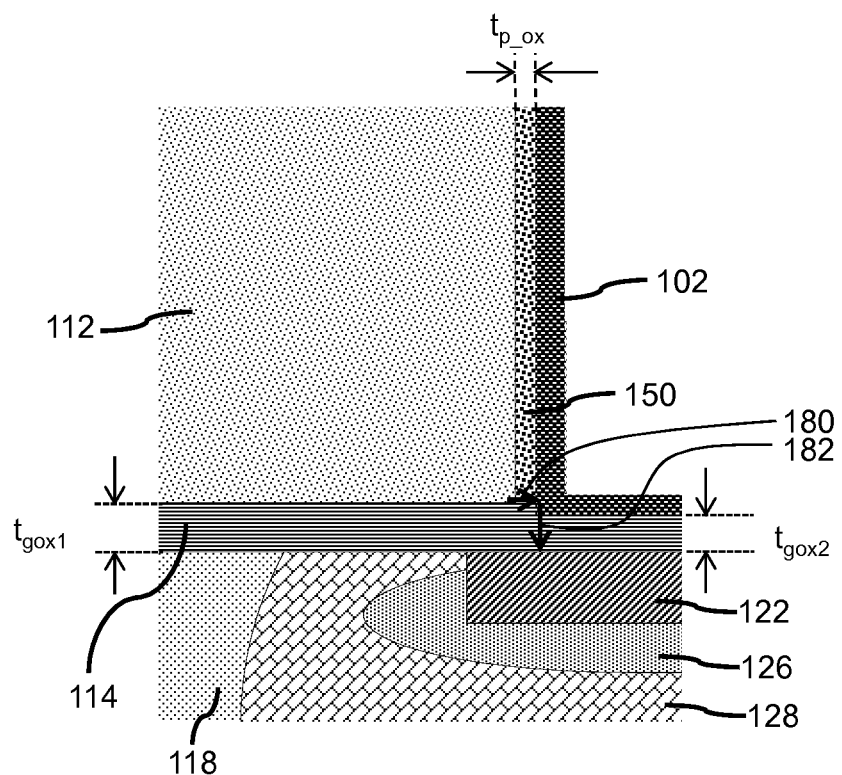

FIG. 3 presents a section 199 of FIG. 2. A first portion of the gate oxide layer 114, which is a portion that is sandwiched between the poly silicon layer 112 and the epitaxy layer 118 (with body region 128), has a first layer thickness that is indicated with $t_{gox1}$. A second portion of the gate oxide layer 114, which is a portion that is sandwiched between the source region 122 and the second silicon nitride layer 102, has a second layer thickness that is indicated with $t_{gox2}$. In practical situations, the second portion of the gate oxide layer 114 has a smaller second layer thickness $t_{gox2}$ than the first layer thickness $t_{gox1}$ of the first portion of the gate oxide layer 114. This is the result of an etching step that has been performed to create the second opening 132 (of FIG. 2). Typically, the etching step removes 70 Ångström at the second portion of the gate oxide layer 114, however, after a later performed oxidation steps the typical difference between the first layer thickness $t_{gox1}$ and the second layer thickness $t_{gox2}$ is reduced because the second portion partially re-oxidizes in the subsequently performed oxidation steps. The inventors have found that, in such a situation, a premature current injection may occur from the polysilicon layer 112 to the body region 128/source region 122 via the surface of the silicon nitride layer 102. The current injection is a tunnelling through the gate oxide layer 114 and the oxidized polysilicon layer 150. The arrows 180, 182 indicate a trajectory of the current (which means that electrons travel in a direction reverse to the direction of the arrows 180, 182). It is a complex mechanism in which the second silicon nitride layer 102 is also involved, however, it is believed that the electrons do not travel through the second silicon nitride layer 102, but follow an interface between the second silicon nitride layer 102 and the gate oxide layer 114 and/or an interface between the second silicon nitride layer 102 and the second oxidized polysilicon layer 150.

The second oxidized polysilicon layer 150 has a lateral thickness indicated in FIG. 3 by $t_{p\_ox}$. The lateral thickness $t_{p\_ox}$ is measured in a direction from the polysilicon layer 112 towards the second opening 132 (see FIG. 2). The premature current injection does not occur when the first layer thickness $t_{gox1}$ is smaller than the sum of the second layer thickness $t_{gox2}$ and the lateral thickness $t_{p\_ox}$. If this condition is true, the "normal current injection" from the polysilicon layer 112 to the epitaxy layer 118 occurs instead of the premature current injection when a voltage difference between the gate (polysilicon layer 112) and the epitaxy layer 118 becomes too large. As such, according to this embodiment, the oxidized polysilicon layer 150 has a thickness which prevents the premature current injection from the second gate (polysilicon 112) to the epitaxial layer 118 (including the body region 128, etc.). In other words, the second oxidized polysilicon layer 150 is present in the power field effect transistor 200 of FIG. 2 to prevent that a premature current injection takes place. It is to be noted that the second oxidized polysilicon 150 of the power field effect transistor 200 of FIG. 2 is not manufactured by means of depositing additional material, but is an oxidized sidewall of the polysilicon layer 112. A processing step to oxidize the sidewall is less complex than a processing step in which material must be deposited to such a side-wall. Thereby costs are saved. Oxidizing the sidewalls may, for example, be done with a thermal treatment of the power field effect transistor at a specific moment of time in the production process of the power field effect transistor when the sidewall is not yet covered with the silicon nitride layer 102. As discussed above and will be discussed later in this description, the oxidation may be achieved by applying a pre body drive stage and a body drive stage. Compared to known manufacturing technologies, the sum of the time of the pre body drive stage and the body drive stage does not increase when being compared to the time of a single body drive stage as is known in the prior art. Thus, the oxidizing the sidewalls does not directly increase the manufacturing costs.

In an embodiment, the lateral thickness of the oxidized polysilicon layer 150 is in a range from 50 Ångström to 200 Ångström. In another embodiment, the thickness of the oxidized polysilicon layer 150 is in the range from 70 Ångström to 160 Ångström. In a typical embodiment, the first layer thickness $t_{gox1}$ is in between 300 Ångström and 900 Ångström. In a further typical embodiment, the first layer thickness $t_{gox1}$ is in between 350 Ångström and 700 Ångström.

As discussed above, the actual formation of the body region 128 during the manufacturing of the power field effect transistor comprises a body drive stage. In an embodiment, the power field effect transistor 200 of FIG. 2 was also subject to a pre body drive stage which is applied shortly before the implantation of the dopants of the second conductivity type. The pre body drive stage comprises a thermal treatment of the power field effect transistor under production (in so far as ready at this state of the manufacturing process) with a relatively high temperature (for example, larger than 850 degrees Celsius) during a period of time that is shorter than 45 minutes. It is to be noted that the oxidized polysilicon layer 150 is formed during the pre body drive stage and the body drive stage of the manufacturing process. The total length of these stages must be long enough to obtain a sufficient large lateral thickness $t_{p\_ox}$ which fulfils the above discussed condition.

More will be elucidated about the manufacturing process hereinafter.

Figure 4:
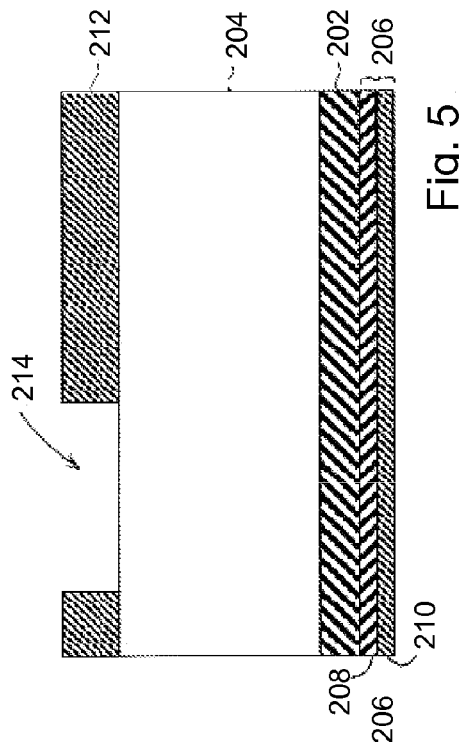
Figure 5:
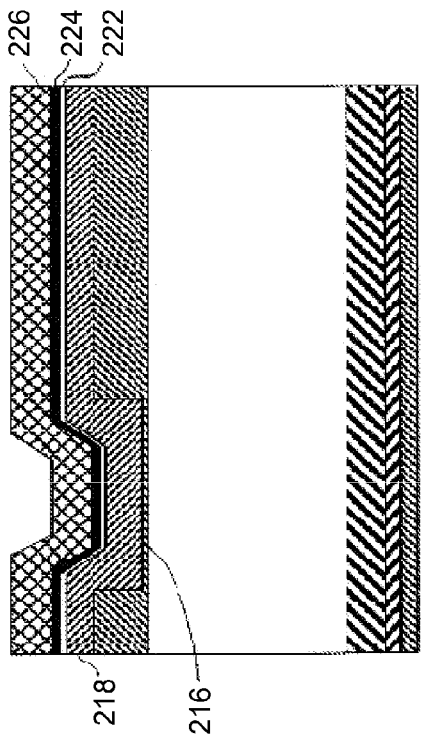

Referring to FIG. 4, a wafer 200 of starting material is either grown or procured for fabricating a plurality of N-type power MOSFET devices. The wafer comprises a highly N-doped substrate 202, upon which an N-type epitaxial layer 204 is grown. The substrate 202 is a <100> substrate doped with Arsenic to yield a resistivity of about a few mΩ·cm. A backseal 206 is formed on a backside of the substrate 202, the backseal 206 comprising an about 1 μm polysilicon (PolySi) backseal layer 208 disposed adjacent an about 1 μm Low Temperature Oxide (LTO) layer 210. An initial oxide layer 212 of silicon dioxide (SiO2) is then grown on top of the epitaxial layer 104 to a depth, in this example, of more than 6000 Å, for example 6750 Å.

Thereafter (FIG. 5), using a known masking technique, an active area 214 is defined using photoresist (not shown) and a part of the initial oxide layer 212 is removed in the active area 214 using a two-step etching technique comprising a dry, plasma, etch step and a wet etch step. Both these etching techniques are known to those skilled in the art and so will not be described further. Once the active area 214 has been etched, the photoresist is subsequently removed.

Figure 6:
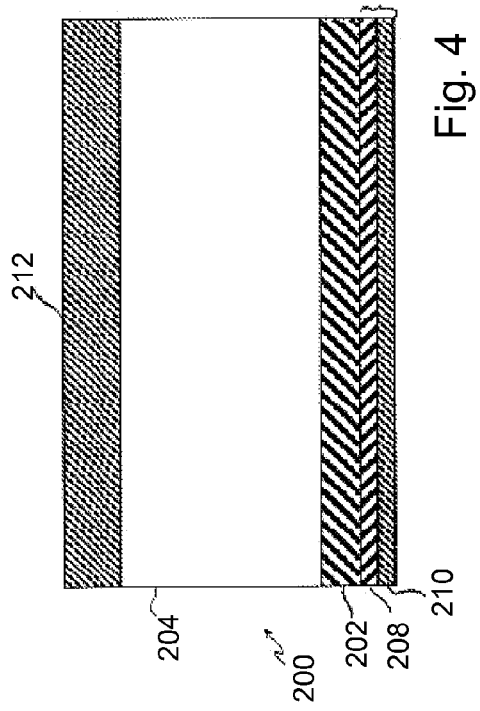

Referring to FIG. 6, in this example 400 Å, a gate oxide layer 216 formed from Silicon Dioxide is then grown in the active area 214, followed by a deposition of another PolySi layer 218 over the wafer 200. In this example, the another PolySi layer 218 is more than 6000 Å thick, for example, 6500 Å. The PolySi layer 218 is then subjected to an N-blanket implantation 220 of Phosphorous ions.

Figure 7:
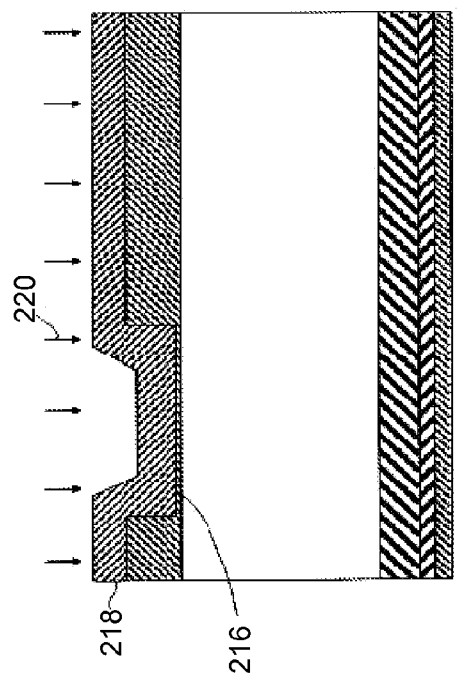

Turning to FIG. 7, an Oxide-Nitride-Oxide (ONO) stack is then formed adjacent the another PolySi layer 218 by growing a polyoxide layer 222 adjacent the PolySi layer 218, followed by deposition of a 450 Å thick Silicon Nitride (Si3N4) layer 224 using a Low Pressure Chemical Vapour Deposition (LPCVD) technique. In this example, the polyoxide layer is about 300 Å thick. An Inter-Layer Dielectric (ILD) layer 226, in this example a 6000 Å Tetra Ethyl OrthoSilicate (TEOS) layer, is then deposited on the Silicon Nitride layer 224.

It is to be noted that in the subsequent figures only a portion of the active area 214 is shown. In other words, the scaling in the y-dimension changes.

Although not shown in FIG. 8, a photoresist gate mask is deposited to define a gate stack 228. Thereafter, a two-stage anisotropic etching process is carried out. Firstly, an exposed part of the ONO stack is removed in an oxide reactive ion plasma etcher. The photoresist layer is then stripped away and the wafer 200 subjected to a cleaning stage. A now-exposed part of PolySi layer 218 is then etched away in a PolySi reactive ion plasma etcher in order to obtain a vertical stack profile comprising a part of the ONO stack in addition to the PolySi layer 218, and constituting the gate stack 228. Etching of the exposed part of the PolySi layer 218 is stopping at the gate oxide layer 216, and once again, the wafer 200 is then subjected to another cleaning stage.

The etched areas in combination with the gate stack 228 constitute an active region 230. The etching carried out in relation to FIG. 8 yields an edge cell 232 and a central cell 234. As is known in the art, a MOSFET device comprises many edge and central cells (not shown), but for the purpose of simplicity of description and hence clarity, only one of each is shown.

According to this embodiment, after the above discussed etching stage, a pre PHV drive stage is provided to the wafer 200. The pre PHV drive stage comprises the stage of exposing the wafer 200 to a thermal cycle, in this example, of more than 20 minutes at a temperature of 1080° C. The pre PHV drive stage may, for example, has a duration of 30 minute, or an even longer duration of, for example, 40 minutes. It is to be noted that in the discussion of FIG. 2 the pre PHV drive stage was termed "pre body drive stage". The pre PHV drive stage has a duration of a maximum time period of 60 minutes, or, in another embodiment, a duration that is shorter than 45 minutes.

Referring to FIG. 9, the active region 230 is subjected to an ion implantation processing stage 236, so that the epitaxial layer 204 beneath the edge cell 232 and the central cell 234 are implanted with positive boron ions 238 as a first stage to a formation of a first P-type High Voltage (PHV) region and a second PHV region (not shown in FIG. 9). During the implantation of the boron ions 238, the gate oxide layer 216 serves as a screen oxide for the PHV ionic implantation.

Turning to FIG. 10*a*, as a second stage to the formation of the first and second PHV "body" regions 240, 242, a PHV drive stage follows the implantation stage 236, consisting of exposing the wafer 200 to a thermal cycle, in this example, of less than 45 minutes at a temperature of 1080° C. Such a relatively short PHV drive stage results in a relatively low on-state resistance Rdson of the manufactured MOSFETs. The duration of the thermal cycle of the PHV drive stage is, for example, 30 minutes, or even shorter, for example, 20 minutes. It is to be noted that in the discussion of FIG. 2 the PHV drive stage was termed "body drive stage". The PHV drive stage has a duration of a minimum time period of 10 minutes, or, in another embodiment, a duration that is longer than 15 minutes.

Although now shown in FIG. 10*a*, and not shown in the subsequent figures, during the above discussed pre PHV drive stage and the above discussed PHV drive stage sidewalls of the PolySi layer 218 (that face toward the previously mentioned central cell 234 and edge cell 232) are oxidized and an oxidized PolySi layer 243 is formed. This is shown in FIG. 10*b*. Thus, at all FIGS. 10*a* and 11 to 19, the oxidized PolySi layer 243 is also present at the locations that are indicated in FIGS. 10*a* and 10*b*. Specific advantages of the oxidized PolySi layer 243 are discussed in the context of FIGS. 2 and 3. In particular, it is to be noted that the PHV drive stage is shortened to obtain a relatively low on-state resistance Rdson and such a relatively short PHV drive stage results in a too thin oxidized PolySi layer 243 such that, as discussed in the context of FIG. 3, a premature current may be injected from the gate to the source regions of the MOSFET. The pre PHV drive stage is introduced to create a thick enough oxidized PolySi layer 243 such that this premature current injection does not occur. At that stage, within the body region is also provided a protection region 126 (as discussed in the context of FIG. 2) which is defined in, and has characteristics according to document U.S. Pat. No. 8,188,539.

Another masking technique is then employed (see FIG. 11), whereby a layer of photoresist 244 is patterned to expose a peripheral region 246 of the central cell 234. The layer of photoresist 244 is then subjected to an N+ implantation stage 245, the exposed peripheral region 246 of the central cell 234 permitting the implantation of Arsenic (As) ions 248 into the second PHV region 242. Thereafter, the layer of photoresist 244 is stripped away.

Figure 12:
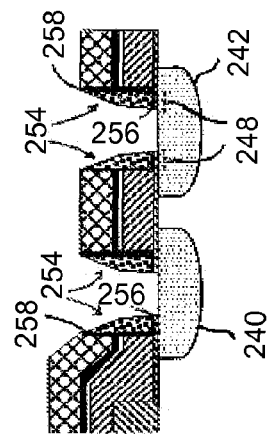
Figure 13:
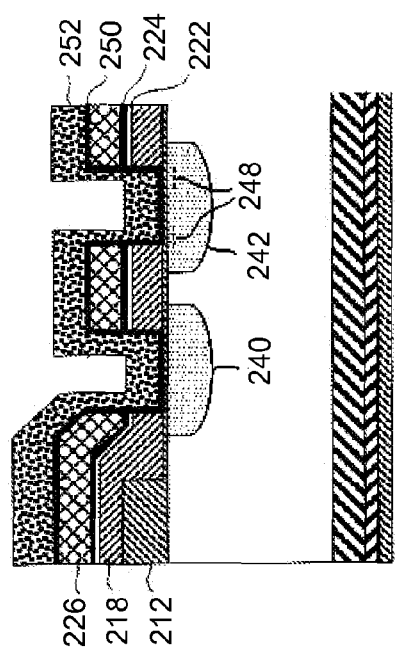

Referring to FIG. 12, a thin nitride layer 250 is then deposited on the wafer 200 using a LPCVD technique. In this example, the nitride layer 250 is formed from Silicon Nitride and is 300 Å thick. Although, in this example, the nitride layer 250 is 300 Å thick, the nitride layer 250 can be between 150 Å thick and 1000 Å thick. In other embodiments, the nitride layer 250 can be between 300 Å and 600 Å thick. Further, the use of silicon nitride to form the nitride layer is only one type of protective layer and it should be appreciated that the function of the nitride layer 250 is to block at least one contaminant, for example hydrogen, and so any suitable material can be used that can block the passage of the at least one contaminant, for example hydrogen, therethrough. In this example in relation to silicon nitride, silane (SiH4) is used by the LPCVD technique at a temperature of between about 700° C. and 750° C. However, whilst the silane, of course, contains hydrogen, the silicon-hydrogen bonds created by use of the LPCVD technique are strong and do not result in the presence of free hydrogen. A TEOS oxide layer 252 is then deposited adjacent the nitride layer 250 using a Low Temperature Oxide (LTO) deposition technique. In this example, the TEOS oxide layer 252 is 6000 Å thick.

Once formed, the nitride layer 250 and the TEOS oxide layer 252 are anisotropically etched (see FIG. 13) in an oxide reactive ion etcher to yield composite spacers 254. Consequently, in the present example, the thickness of the nitride layer 150 is sufficiently thin to avoid any protuberances or cavities being formed that can affect the curved profile of the spacer 254.

A horizontal portion 256 of the nitride layer 250 serves as a protective layer against at least one type of contaminant as will be described in more detail later herein. In this example, the nitride layer 250 has a vertical portion 258 that also protects the gate stack 228.

Figure 14:
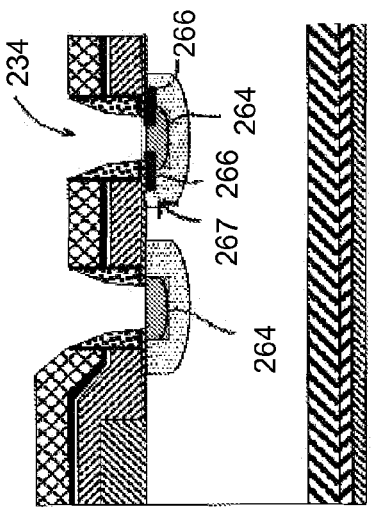
Figure 15:
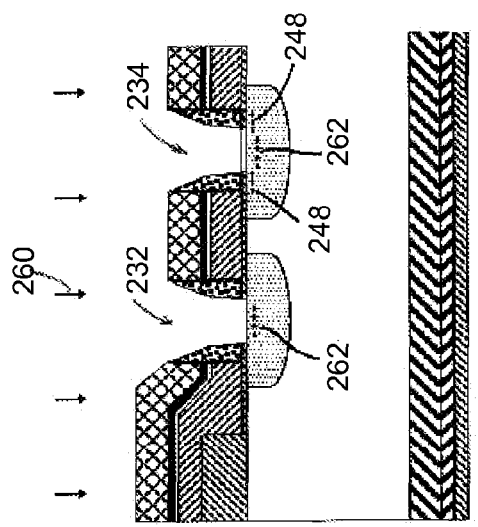
Figure 16:
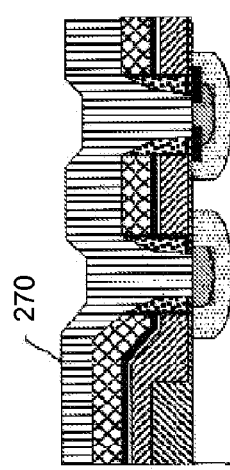
Figure 17:
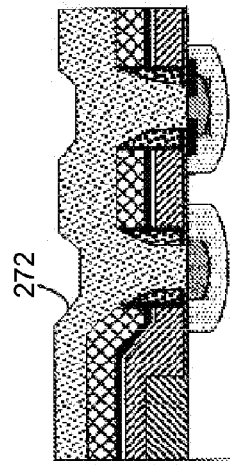

Referring to FIG. 14, a blanket implantation stage 260 is then carried out to implant boron ions 262 into the first and second PHV regions 240, 242 via the edge cell 232 and the central cell 234, respectively. This implantation stage 260 is carried out in order to fix the potential of the PHV body regions 240, 242 and improve the so-called unclamped inductive switching behaviour of the device. Turning to FIG. 15, the implanted arsenic ions 248 and the implanted boron ions 262 are subjected to a thermal cycle of 30 minutes at more than 850° C., for example, 900° C., and constituting an anneal stage. This stage is known in the art and so, for conciseness, will not be described further. As a result of the above anneal stage, the first PHV region 240 of the edge cell 232 only comprises a p+ region 264. With respect to the central cell 234, the second PHV region 242 comprises a p+ region 264 therein and an annular n-type Source/Drain (n s/d) region 266 bridging the p+ region beneath the central cell 234. In should be understood that the n s/d region 266 constitutes a source of one central cell of the device.

A region adjacent the surface of and in the second PHV region 242 between the peripheries of the second PHV region 242 and the n s/d region 266 constitutes a channel region 267. Due to the nature of the formation of the second PHV region 242, the level of doping of the channel region 267 at a first end thereof adjacent the source 266 is higher than at a second end thereof adjacent the periphery of the second PHV region 242. In this respect, the level of doping from the first end of the channel region 267 to the second end of the channel region 267 decreases gradually, i.e. is graduated. In the present example, the first end of the channel region 267 is very close to the edge of the gate stack 228, such as 0.13 µm therefrom. However, the horizontal part 256 of the nitride layer 250 overlaps a substantial part of the source 266, thereby providing protection to the channel region, especially the first end of the channel region 267 from the at least one contaminant mentioned above, for example, hydrogen.

A further photoresist layer 270 (FIG. 16) is then deposited over an uppermost surface of the wafer 200 using a known masking technique. Although not shown in FIG. 16 due to the gate contact (also not shown) being at the periphery of the active region 230, the photoresist layer 270 comprises apertures that, when the device thus far is subjected to a reactive ion etching stage, result in openings (not shown) being formed for the deposition of metal therein so as permit the connection of a source pad (not shown) and a gate stack pad (not shown) to pads of a device package frame (not shown) by aluminium wires. Once etched, the photoresist layer 270 is stripped away and an aluminium-silicon layer 272 is deposited (FIG. 17) using a sputtering technique known in the art. The aluminium-silicon layer 272 is deposited to a thickness of about 10 µm. Thereafter, the aluminium-silicon layer 272 is covered with another photoresist layer (not shown) using a known masking technique, and then etched in a spray etcher. In order to obtain a good metal-silicon alloy, the wafer undergoes a sinter step in a low temperature furnace, in this example, at a temperature of 390° C. for 30 minutes.

Figure 18:
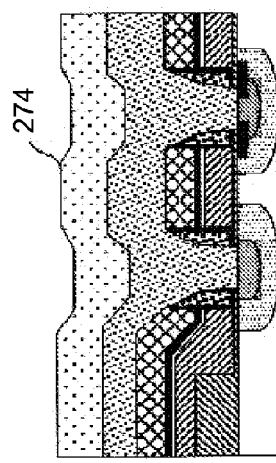
Figure 19:
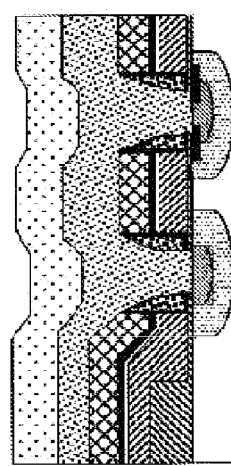

Referring to FIG. 18, a passivation nitride-above-oxide stack 274 comprising a layer of Silicon Nitride on Undoped Silicon Glass (USG) is deposited using a Plasma Enhanced Chemical Vapour Deposition (PECVD) system and, after a photomasking technique, etched in a oxide reactive ion etcher. However, in another embodiment, the passivation stack 274 can be replaced with one or more layers of material suitable for performing the role of passivation that do not introduce, or alternatively, minimise the introduction of free hydrogen into the device. In this respect, the passivation stack comprises a predetermined amount of free hydrogen, free hydrogen being hydrogen atoms or ions that are weakly bonded within the passivation stack 274 and are freed or released from their respective bonds by energy imparted to break the bonds through mechanical stresses. In this example, the hydrogen is weakly bonded to silicon to form silicon-hydrogen bonds. The predetermined amount of free hydrogen should not be sufficient to cause drift of a threshold voltage of the power MOSFET device when the device is in use.

After provision of the passivation stack 274 (FIG. 19), the PolySi backseal layer 208 and LTO backseal layer 210 are removed using a backgrinding technique known in the art until the wafer 200 is about 250 µm thick, and a Titanium-Nickel-Vanadium-Silver alloy layer 276 is deposited on the back-side of the substrate 202 using a known metallisation technique to form a drain.

The above example is of an N-type epitaxial power MOSFET. It should therefore be appreciated that the above example can be modified to create a P-type epitaxial MOS-FET device. Moreover, whilst the above example has been described in the context of a power MOSFET device, the provision of the protective layer described above can be applied to other Field Effect Transistor (FET) devices requiring protection of the channel region from contaminants, for example MOSFETs, i.e. non-power MOSFETs.

In summary, in this application a power field effect transistor, a power field effect transistor device and a method of manufacturing a power field effect transistor are provided. During the manufacturing of the power field effect transistor, a body drive stage to manufacture the body region of the power field effect transistor is shortened to obtain a relatively low on resistance for the power field effect transistor. Before the implanting stage of the dopants of the body region, a pre body drive stage is introduced. During the pre body drive stage and the body drive stage sidewalls of a polysilicon layer of the power field effect transistor are oxidized to obtain a power field effect transistor which has at the sidewalls an oxidized polysilicon layer that is thick enough to prevent a premature current injection from the gate to the source regions of the power field effect transistor.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

The semiconductor substrate described herein can be any semiconductor material or combinations of materials, such as gallium arsenide, silicon germanium, silicon-on-insulator (SOI), silicon, monocrystalline silicon, the like, and combinations of the above.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. \

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or stages then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A power field effect transistor comprising:
   a semiconductor layer of a first conductivity type, the first semiconductor layer having a first side,
   a body region of a second conductivity type formed at the first side inside the semiconductor layer,
   source regions of the first conductivity type formed at the first side within the body region,
   a patterned gate oxide layer superimposed at the first side on the semiconductor layer with a first opening over the body region,
   a patterned polysilicon layer superimposed to at least a portion of the patterned gate oxide layer,
   a lateral oxidized polysilicon layer at a sidewall of the patterned polysilicon layer, the sidewall facing towards a the first opening in the patterned gate oxide layer, wherein a lateral thickness (tp_ox) of the lateral oxidized polysilicon layer measured in the lateral direction is thick enough for preventing a premature current injection in the manufactured power field effect transistor from the patterned polysilicon layer source regions of the manufactured power field effect transistor.

2. A power field effect transistor according to claim 1, wherein the patterned polysilicon layer comprises a second opening, the second opening is larger than the first opening and fully overlaps the first opening, the patterned gate oxide layer comprises a first area adjacent to the first opening that is not covered by the patterned polysilicon layer.

3. A power field effect transistor according to claim 2, wherein the patterned gate oxide layer has a first thickness (tgox2) at the first area measured in a direction perpendicular to the semiconductor layer, the patterned gate oxide layer has a second thickness (tgox2) at a second area of the patterned gate oxide which is in between the patterned polysilicon layer and the semiconductor layer, wherein the sum of the first thickness (tgox2) and the lateral thickness (tp_ox) is larger than the second thickness (tgox1).

4. A power field effect transistor according to claim 3, wherein the first thickness (tgox2) is smaller than the second thickness (tgox1).

5. A power field effect transistor according to claim 1, wherein the lateral thickness (tp_ox) is smaller than 200 Ångström, and, optionally, the lateral thickness (tp_ox) is larger than 50 Ångström.

6. A power field effect transistor according to claim 1, further comprising a patterned stack of an oxidized polysilicon layer and a silicon nitride layer superimposed to the patterned polysilicon layer, the oxidized polysilicon layer being adjacent to the patterned polysilicon layer.

7. A power field effect transistor according to claim 2 further comprising
   a further silicon nitride layer provided on i) a first surface of the of the lateral oxidized polysilicon layer, the first surface facing away from the patterned polysilicon layer towards the first opening, ii) a second surface of the first area of the patterned gate oxide layer, the second surface facing away from the semiconductor layer.

8. A power field effect transistor of claim 7, wherein a spacer of a dielectric material is provided in a corner defined by the further silicon nitride layer provided on the first surface and on the second surface.

9. A power field effect transistor according to claim 8, wherein an electrically conductive material is provided in a space surrounded by the spacer and adjacent to the first opening of the patterned gate oxide layer.

10. A power field effect transistor according to claim 1, wherein the semiconductor layer of the first conductivity type comprises a stack of a first layer and of a second layer, wherein the first layer is a base material doped with dopants of the first conductivity type and the second layer is an epitaxial layer grown on top of the first layer, the second layer is also doped with dopants of the first conductivity type, the first side being a surface of the second layer that faces away from the first layer.

11. A power field effect transistor device, the power field effect transistor device comprising a plurality of power field effect transistors according to claim 1.

* * * * *